(12) United States Patent
Chang et al.

(10) Patent No.: US 11,524,890 B2
(45) Date of Patent: Dec. 13, 2022

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Yung-Hsing Chang, Kaohsiung (TW); Yueh-Ju Lin, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 147 days.

(21) Appl. No.: 16/670,683

(22) Filed: Oct. 31, 2019

(65) Prior Publication Data

US 2021/0130165 A1  May 6, 2021

(51) Int. Cl.
*B81B 7/00* (2006.01)
*B81C 1/00* (2006.01)

(52) U.S. Cl.
CPC .......... *B81B 7/0051* (2013.01); *B81B 7/0061* (2013.01); *B81C 1/00309* (2013.01); *B81C 1/00325* (2013.01); *B81B 2207/098* (2013.01); *B81C 2203/0154* (2013.01)

(58) Field of Classification Search
CPC .................................................... B81B 7/0051
See application file for complete search history.

(56) References Cited

U.S. PATENT DOCUMENTS

| | | | | |
|---|---|---|---|---|
| 2012/0027234 | A1* | 2/2012 | Goida | H04R 1/04 381/150 |
| 2012/0175747 | A1* | 7/2012 | Schlarmann | H04R 31/00 438/107 |
| 2013/0341739 | A1* | 12/2013 | Chang | B81B 7/0064 257/417 |
| 2015/0303173 | A1* | 10/2015 | Maydar | H01L 23/147 257/664 |
| 2017/0245035 | A1* | 8/2017 | Lee | H01L 24/32 |
| 2017/0313579 | A1* | 11/2017 | Ghidoni | B81B 7/0061 |
| 2019/0270636 | A1* | 9/2019 | Schaller | B81C 1/0023 |

* cited by examiner

*Primary Examiner* — Moazzam Hossain
(74) *Attorney, Agent, or Firm* — Foley & Lardner LLP

(57) ABSTRACT

A semiconductor device package includes a redistribution layer structure, a lid, a sensing component and an encapsulant. The lid is disposed on the redistribution layer structure and defines a cavity together with the redistribution layer structure. The sensing component is disposed in the cavity. The encapsulant surrounds the lid.

20 Claims, 16 Drawing Sheets

SEMICONDUCTOR DEVICE PACKAGES AND METHODS OF MANUFACTURING THE SAME

BACKGROUND

1. Field of the Disclosure

The present disclosure relates to semiconductor device packages and methods of manufacturing the same.

2. Description of Related Art

MEMS (as used herein, the term "MEMS" may be used to refer to a singular microelectromechanical system or to a plurality of microelectromechanical systems) can be used in semiconductor devices to detect a signal (such as sound, movement or motion, pressure, gas, humidity, temperature, and the like) and to transform the detected signal to an electrical signal.

Semiconductor devices (e.g., semiconductor devices using MEMS) are usually installed on a substrate that includes electrical circuitry, such as a circuit board, and then enclosed with a housing. The trend is driven at least in part by the demand for smaller sizes. It may be desirable in some cases to reduce the thickness of the substrate. However, a rigidity of a thin substrate may be deteriorated which causes undesired warpage.

SUMMARY

According to some embodiments of the present disclosure, a semiconductor device package includes a redistribution layer structure, a lid, a sensing component and an encapsulant. The lid is disposed on the redistribution layer structure and defines a cavity together with the redistribution layer structure. The sensing component is disposed in the cavity. The encapsulant surrounds the lid.

According to some embodiments of the present disclosure, a semiconductor device package includes a redistribution layer structure, a semiconductor device, a housing, and an encapsulant. The first semiconductor device is disposed on the redistribution layer structure. The housing is disposed on the redistribution layer structure and encloses the semiconductor device. The encapsulant encapsulates the housing.

According to some embodiments of the present disclosure, a method of manufacturing a semiconductor device package includes disposing a sensing component on a redistribution layer structure; disposing a lid on the redistribution layer structure to enclose the sensor; and forming an encapsulant to surround the lid.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1A:
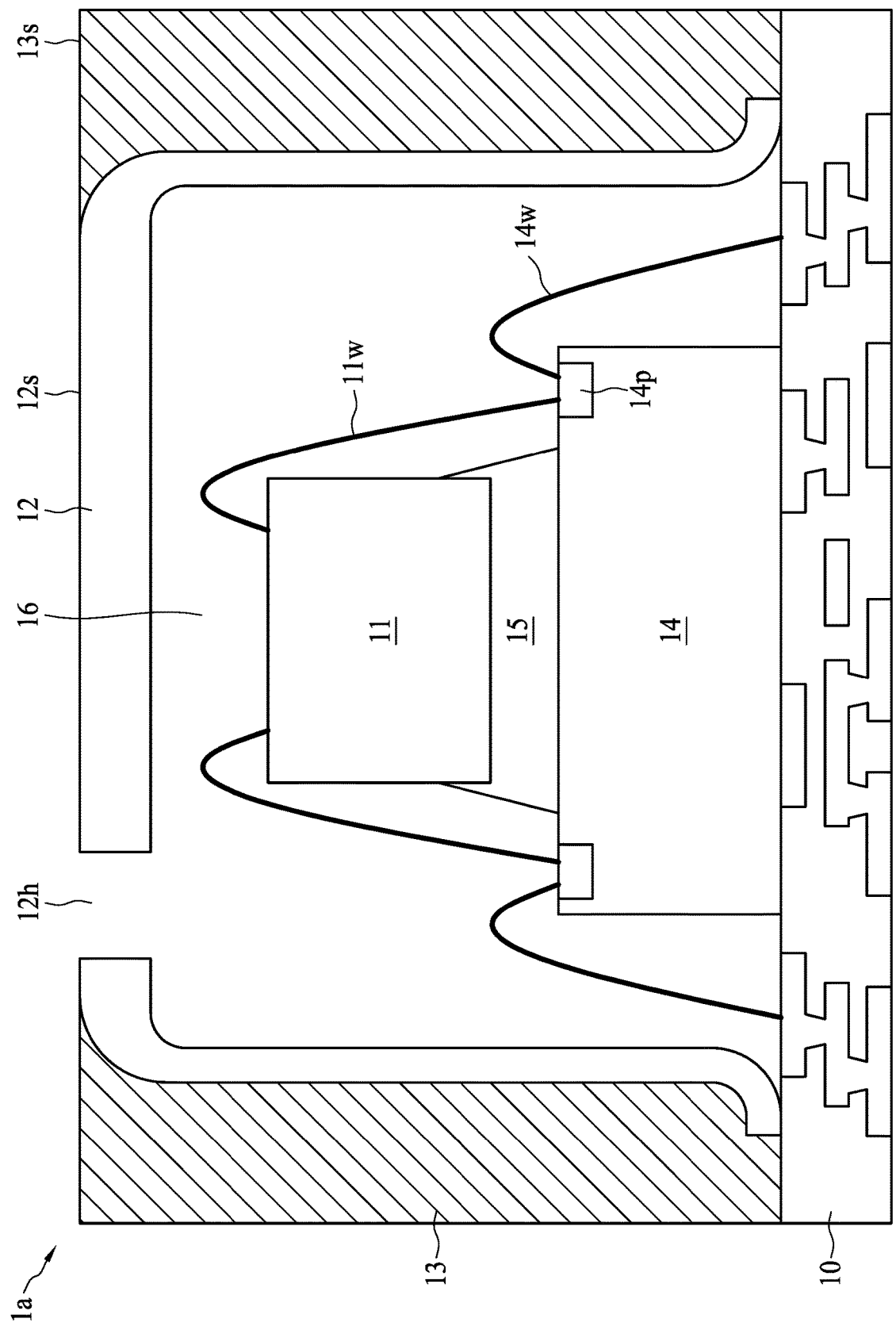
FIG. 1A is a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Various semiconductor device packages including semiconductor devices (e.g., semiconductor devices using MEMS), have been proposed wherein the semiconductor devices are disposed on a substrate and enclosed with a housing. In some embodiments, a thick and rigid substrate (such as a ceramic substrate with a thickness up to 200 µm) is used, so warpage is low. It would be desirable to reduce the thickness of the substrate without increasing warpage.

The present disclosure describes techniques suitable for the manufacture of smaller semiconductor device packages allowing low warpage.

FIG. 1A is a cross-sectional view of a semiconductor device package in accordance with some embodiments of the present disclosure.

Referring to FIG. 1A, the semiconductor device package 1a may include a redistribution layer (RDL) structure 10, a semiconductor device 11 or 14, a lid (e.g. a housing) 12 and an encapsulant 13.

The RDL structure 10 may include one or more redistribution layers and insulation material(s) or dielectric material(s) (not denoted in FIG. 1A) encapsulating the one or more redistribution layers. The RDL structure 10 may include a fan-out layer. The insulation material(s) or dielectric material(s) may include organic material, solder mask, polyimide (PI), epoxy, Ajinomoto build-up film (ABF), molding compound, or a combination of two or more thereof.

The RDL structure 10 may include conductive trace(s), pad(s), contact(s), via(s) to electrically connect the one or more redistribution layers with each other, or electrically connect the RDL structure to the semiconductor device, or electrically connect the RDL structure to an external circuit or electronic device (not showed).

The RDL structure 10 may have a thickness less than or equal to 200 µm less than or equal to 180 µm less than or equal to 160 µm less than or equal to 140 µm less than or equal to 130 µm, less than or equal to 120 µm less than or equal to 110 µm, less than or equal to 100 µm less than or equal to 90 µm, less than or equal to 80 µm, less than or equal to 70 µm, less than or equal to 60 µm, less than or equal to 50 µm, or less than or equal to 40 µm.

The semiconductor device 11 or 14 is disposed on the RDL structure 10. In some embodiments, the semiconductor device 11 or 14 is disposed on and in direct contact with the RDL structure 10. In some embodiments, the semiconductor device may include, for example but is not limited to, a sensing component (e.g. a MEMS device, a pressure sensor and a microphone), a processor, a controller (e.g. a memory controller), a microcontroller (MCU), a memory die, a power device, a high speed input/output device or other electronic component(s). In some embodiments, the semiconductor devices may include two or more semiconductor devices stacked with each other or arranged side by side on a top surface of the RDL structure 10. The two or more semiconductor devices may be electrically connected to or electrically isolated from each other.

In some embodiments as illustrated in FIG. 1A, the semiconductor device includes a first semiconductor device 11 and a second semiconductor device 14. The first semiconductor device 11 is disposed (e.g., stacked) on the second semiconductor device 14 and the second semiconductor device 14 is disposed on the RDL structure 10. In some embodiments, the first semiconductor device 11 is the same as or similar to the second semiconductor device 14. In some embodiments, the first semiconductor device 11 is different from the second semiconductor device 14. In some embodiments, the first semiconductor device 11 may include a sensing component (e.g. a MEMS device, a pressure sensor and a microphone) or other electronic component(s), and the second semiconductor device 14 may include a processor, a controller (e.g. a memory controller), a microcontroller (MCU), a memory die, a power device, a high speed input/output device or other electronic component(s).

In some embodiments, the first semiconductor device 11 may be electrically connected to the second semiconductor device 14 by a connection wiring 11w. In some embodiments, the second semiconductor device 14 is electrically connected to the RDL structure 10 by a connection wiring 14w. The second semiconductor device 14 may have a pad 14p. The connection wiring 11w may be disposed in direct contact with the pad 14p. The connection wiring 14w may be disposed in direct contact with the connection pad 14p.

The lid 12 (e.g. a housing) is disposed on the RDL structure 10 and defines, together with the RDL structure 10, a cavity 16 to accommodate the semiconductor device 11 or 14. In some embodiments, the lid 12 encloses the semiconductor device 11 or 14.

The lid 12 has an upper surface 12s. In some embodiments, the lid 12 defines a penetration hole 12h exposed from the upper surface 12s of the lid 12. The penetration hole 12h penetrates the lid 12 to communicate the cavity 16 with the external environment.

In some embodiments, the lid 12 may include a conductive thin film or a metal layer (e.g., a metal lid), and may include, for example, aluminum, copper, chromium, tin, gold, silver, nickel or stainless steel, or a mixture, an alloy, or other combination thereof. In some embodiments, the lid 12 is a metal lid. The metal lid 12 can provide electromagnetic interference (EMI) shielding for the semiconductor device 11 or 14.

In some embodiments, the lid 12 is surrounded or encapsulated by the encapsulant 13. The encapsulant 13 is disposed on the RDL structure 10 and surrounds or encapsulates the lid 12. In some embodiments, the encapsulant 13 is disposed in direct contact with the lid 12. The encapsulant 13 has an upper surface 13s.

In some embodiments, the upper surface 12s of the lid 12 and the upper surface 13s of the encapsulant 13 is substantially coplanar with each other as illustrated in FIG. 1A. In some embodiments, the height of the encapsulant 13 may be substantially the same as the height of the lid 12. In some other embodiments, the height of the encapsulant 13 may be lower than the height of the lid 12. In some embodiment, the upper surface 12s of the lid 12 is higher than the upper surface 13s of the encapsulant 13.

The encapsulant 13 enhances the rigidity of the semiconductor device package 1a so that the semiconductor device package 1a can be manufactured by using a substrate with a smaller thickness (e.g., the RDL structure 10) without increasing warpage. Therefore, the total thickness of the semiconductor device package 1a can be reduced. In some embodiment, the semiconductor device package 1a may have a thickness less than 850 µm, for example, less than or equal to 840 µm, less than or equal to 820 µm, less than or equal to 800 µm, less than or equal to 780 µm, less than or equal to 760 µm, less than or equal to 740 µm, less than or equal to 720 µm, less than or equal to 710 µm, less than or equal to 700 µm, or less than or equal to 680 µm.

The encapsulant 13 may include insulation or dielectric material. In some embodiment, the encapsulant 13 be made of molding material that may include, for example, a Novolac-based resin, an epoxy-based resin, a silicone-based resin, or other another suitable encapsulant. Suitable fillers may also be included, such as powdered $SiO_2$.

Although FIG. 1A illustrates two stacked semiconductor devices 11 and 14, it is contemplated that the semiconductor device package as shown in FIG. 1A may include more or less semiconductor devices as discussed above.

In some embodiment, the semiconductor device package further includes an adhesion layer 15 (e.g., a die attach film (DAF)). In some embodiment, the adhesion layer 15 may be disposed between the RDL structure 10 and the semiconductor device(s) to attach the semiconductor device(s) on the RDL structure 10. In some embodiment, the adhesion layer 15 may be disposed between two stacked semiconductor devices to attach the semiconductor devices with each other.

Figure 1B:
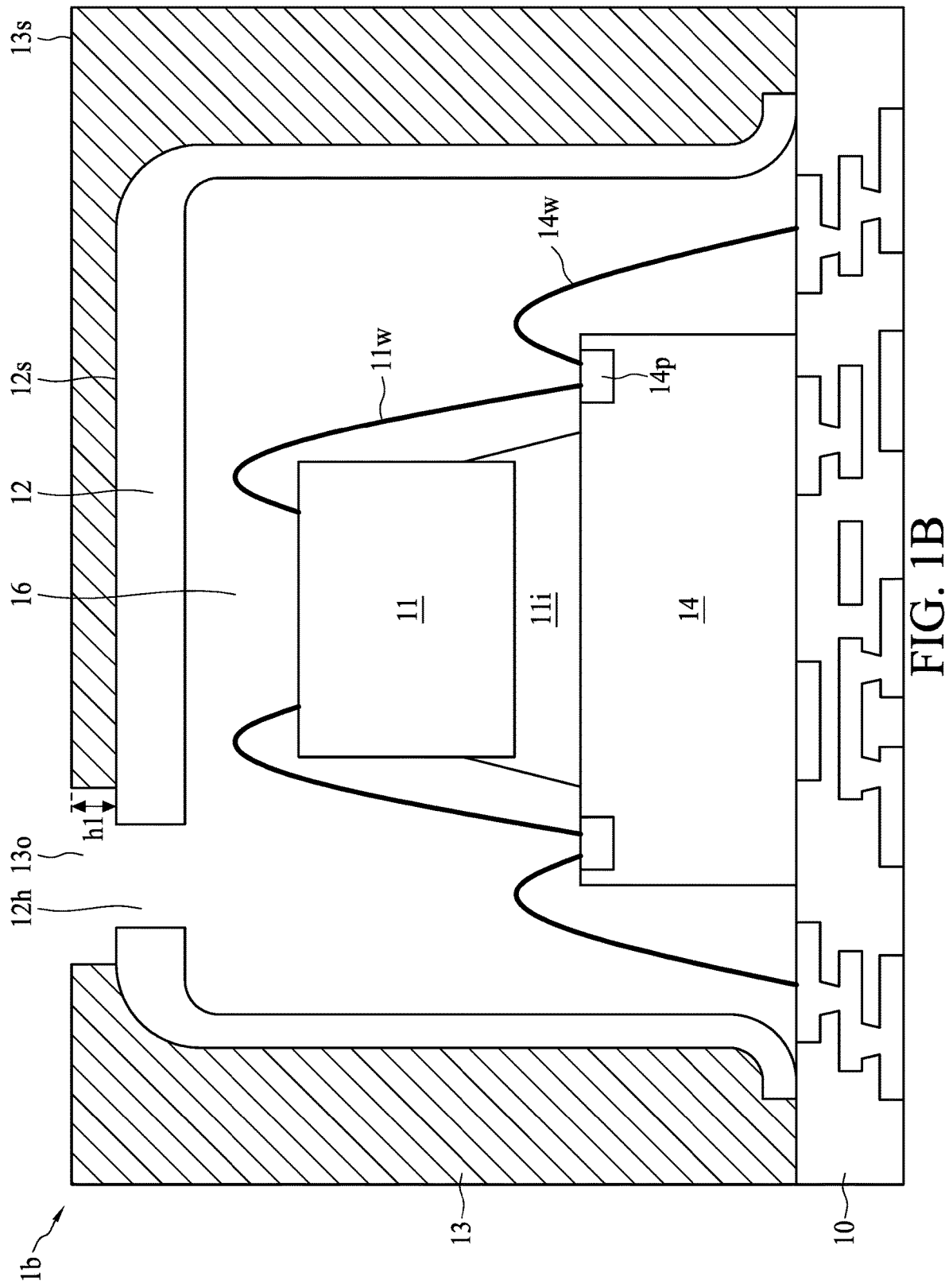
FIG. 1B is a cross-sectional view of another semiconductor device package in accordance with some embodiments of the present disclosure.

FIG. 1B is a cross-sectional view of another semiconductor device package in accordance with some embodiments of the present disclosure.

Referring to FIG. 1B, the semiconductor device package 1b may be similar to the semiconductor device package 1a as described and illustrated with reference to FIG. 1A, except that the upper surface 12s of the lid 12 is lower than the upper surface 13s of the encapsulant 13. The encapsulant 13 may partially or totally cover the upper surface 12s of the lid 12. The encapsulant 13 defines an opening 13o exposing the penetration hole 12h of the lid 12. In some embodiments, the opening 13o of the encapsulant 13 may have a dimension larger than a dimension of the penetration hole 12h of the lid 12. In some embodiments, the opening 13o of the encapsulant 13 may have a dimension substantially the same as a dimension of the penetration hole 12h of the lid 12.

Figure 2:
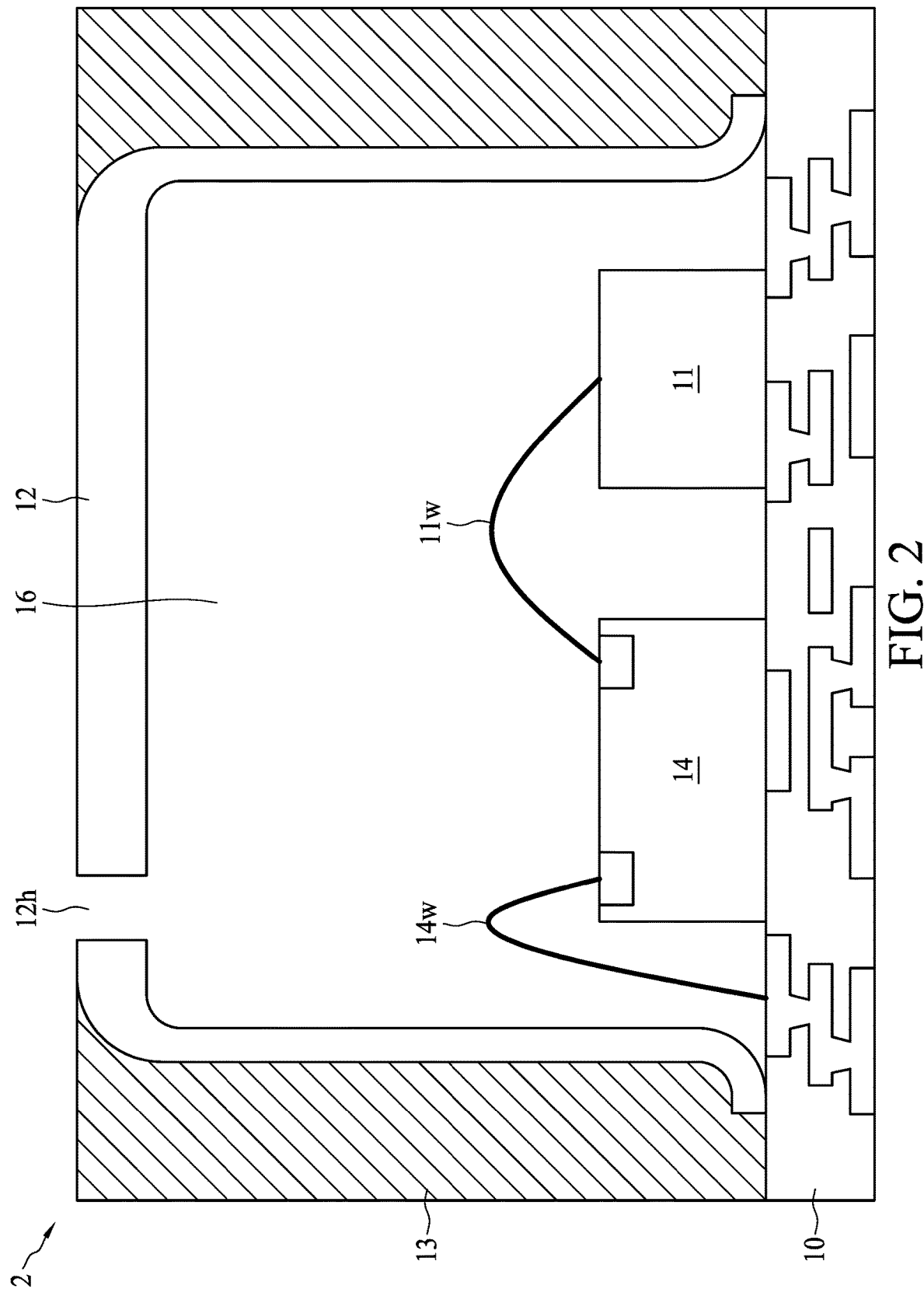
FIG. 2 is a cross-sectional view of another semiconductor device package in accordance with some embodiments of the present disclosure.

FIG. 2 is a cross-sectional view of another semiconductor device package in accordance with some embodiments of the present disclosure.

Referring to FIG. 2, the semiconductor device package 2 may be similar to the semiconductor device package 1a as described and illustrated with reference to FIG. 1A, except that the first semiconductor device 11 and the second semiconductor device 14 are arranged side by side on the RDL structure 10.

In some embodiments, the present disclosure provides a semiconductor device package 1a including a redistribution layer structure 10, a semiconductor device 11, a housing 12, and an encapsulant 13 as illustrated in FIG. 1A, FIG. 1B and FIG. 2. The semiconductor device 11 is disposed on the redistribution layer structure 10. The housing 12 may be a lid and is disposed on the redistribution layer structure 10 to enclose the semiconductor device 11. The encapsulant 13 encapsulates the housing 12. In some embodiments, the housing 12 may have an opening 12h on a top thereof and the opening 12h is not covered by the encapsulant 13. In some embodiments, a height of the encapsulant 13 is substantially the same as or lower than a height of the top of the housing 12. In some embodiments, a height of the encapsulant is greater than a height the housing 12 and wherein the encapsulant 13 has a recess located above the opening of the housing 12. The details of the RDL structure 10, the semiconductor device 11, the lid 12 and the encapsulant 13 are as described hereinabove.

FIG. 3A, FIG. 3B, FIG. 3C, FIG. 3D, FIG. 3E, FIG. 3G, FIG. 3H and FIG. 3I illustrate various stages of a method for manufacturing a semiconductor device package in accordance with some embodiments of the present disclosure.

Figure 3A:
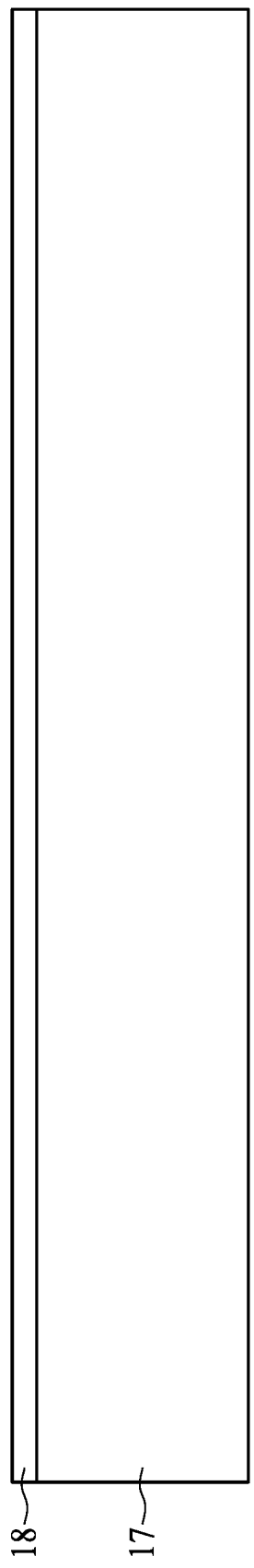
FIG. 3A, FIG. 3B, FIG. 3C, FIG. 3D, FIG. 3E, FIG. 3G, FIG. 3H and FIG. 3I illustrate various stages of a method for manufacturing a semiconductor device package in accordance with some embodiments of the present disclosure.

Referring to FIG. 3A, a carrier 17 (e.g., a glass carrier) is provided. The carrier 17 may include a release layer 18 disposed on a top surface of the carrier 17.

Figure 3B:
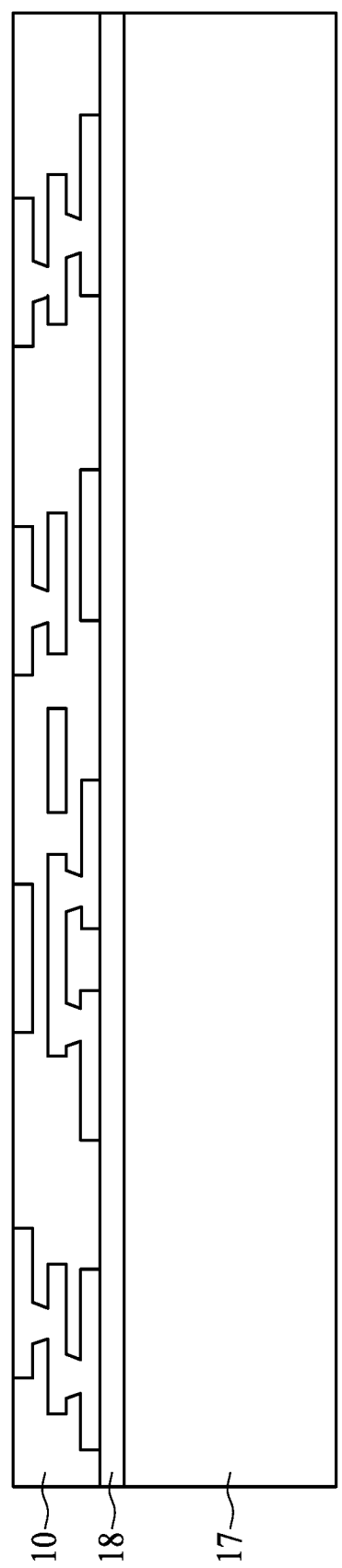

Referring to FIG. 3B, a RDL structure 10 is formed on the release layer 18 of the carrier 17.

Figure 3C:
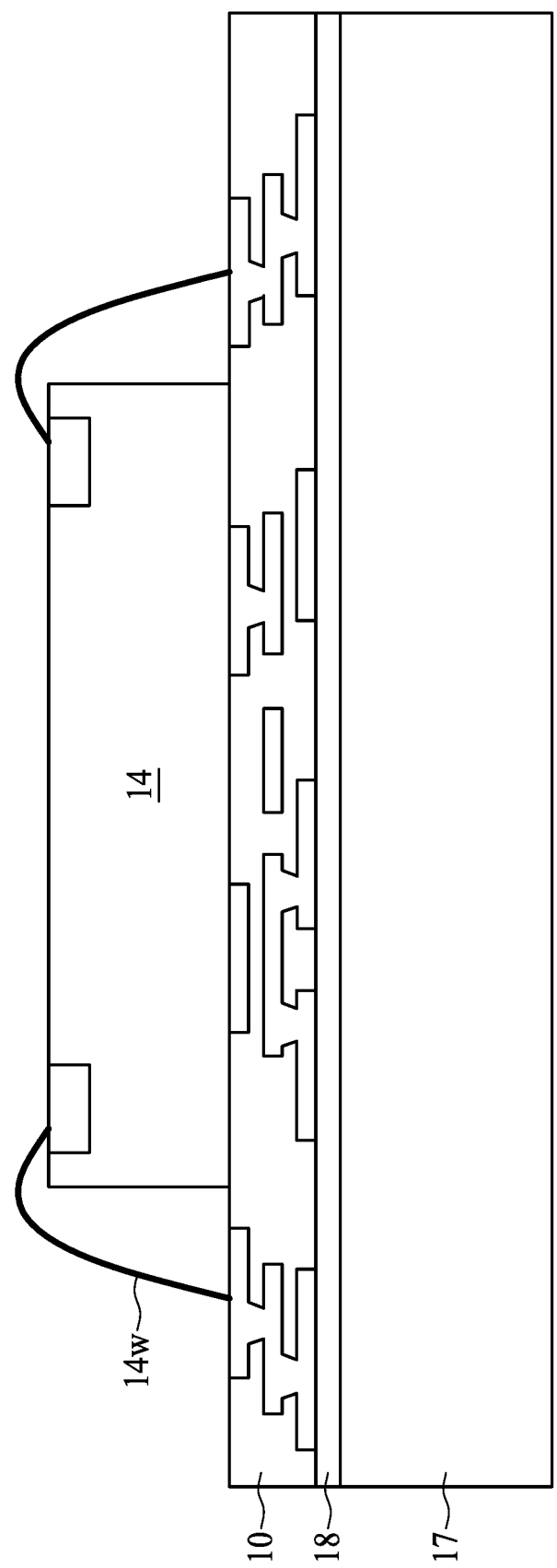

Referring to FIG. 3C, a semiconductor device 14 is disposed on the RDL structure 10. A connection wire 14w may be formed to electrically connect the semiconductor device 14 to the RDL structure 10.

Figure 3D:
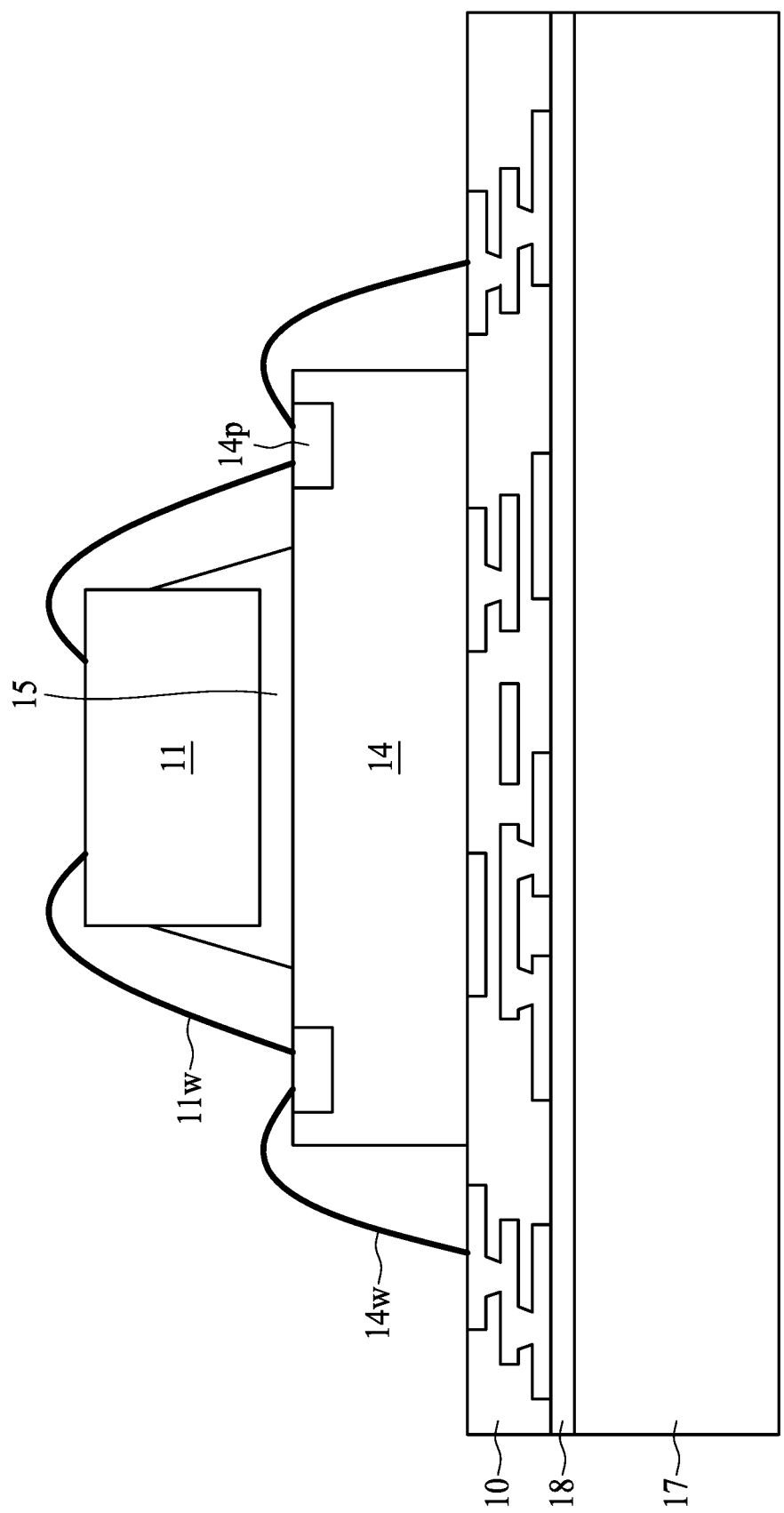

Referring to FIG. 3D, a semiconductor device 11 is disposed on the semiconductor device 14. In some embodiments, the semiconductor device 11 may be attached or bonded on the semiconductor device 14 via a adhesion layer 15. A connection wire 11w may be formed on a connection pad 14p of the semiconductor device 14 to electrically connect the semiconductor device 11 to the semiconductor device 14.

Figure 3E:
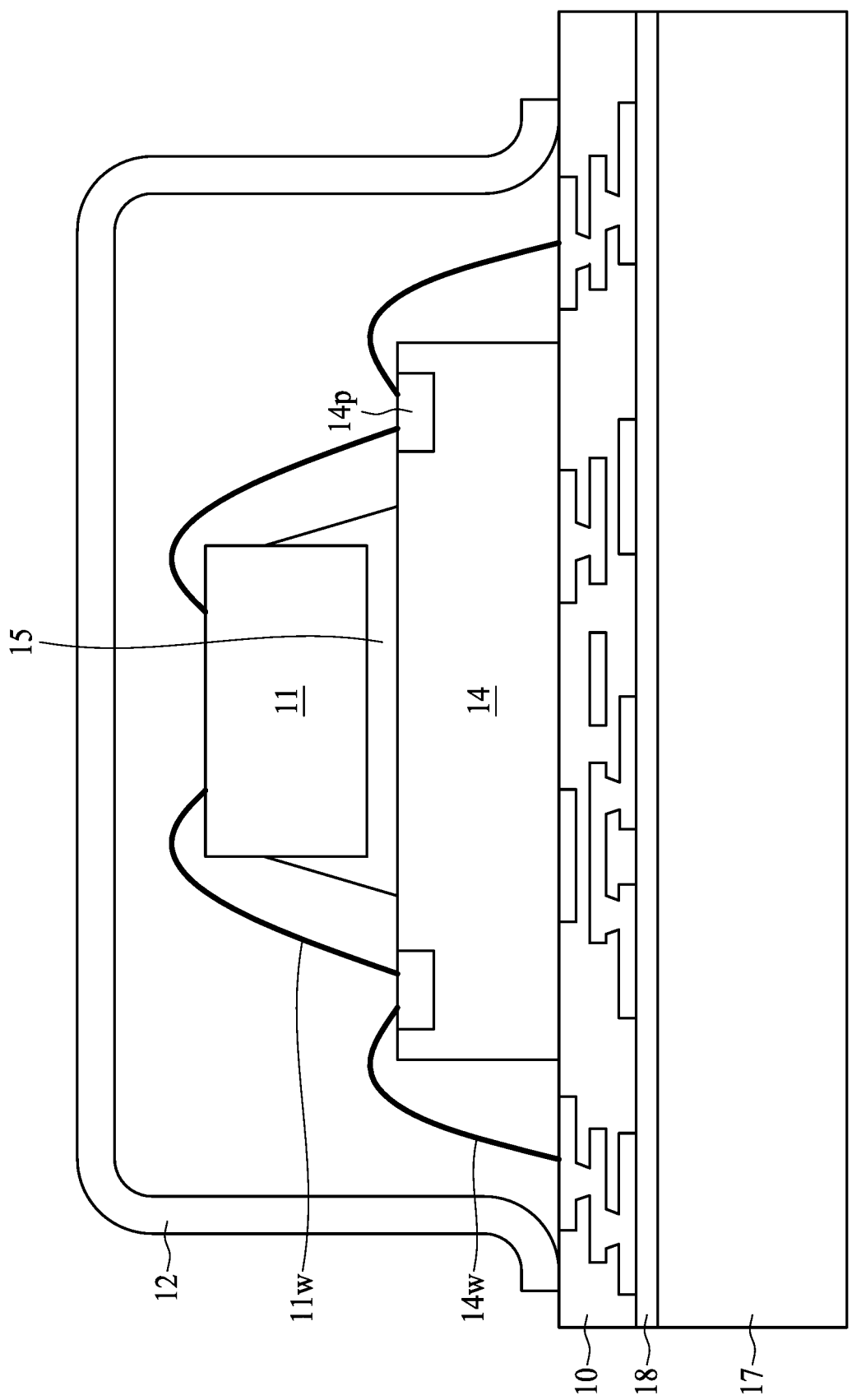

Referring to FIG. 3E, a lid 12 (e.g., a housing) is disposed on the RDL structure 10 and encloses the semiconductor devices 11 and 14.

Figure 3F:
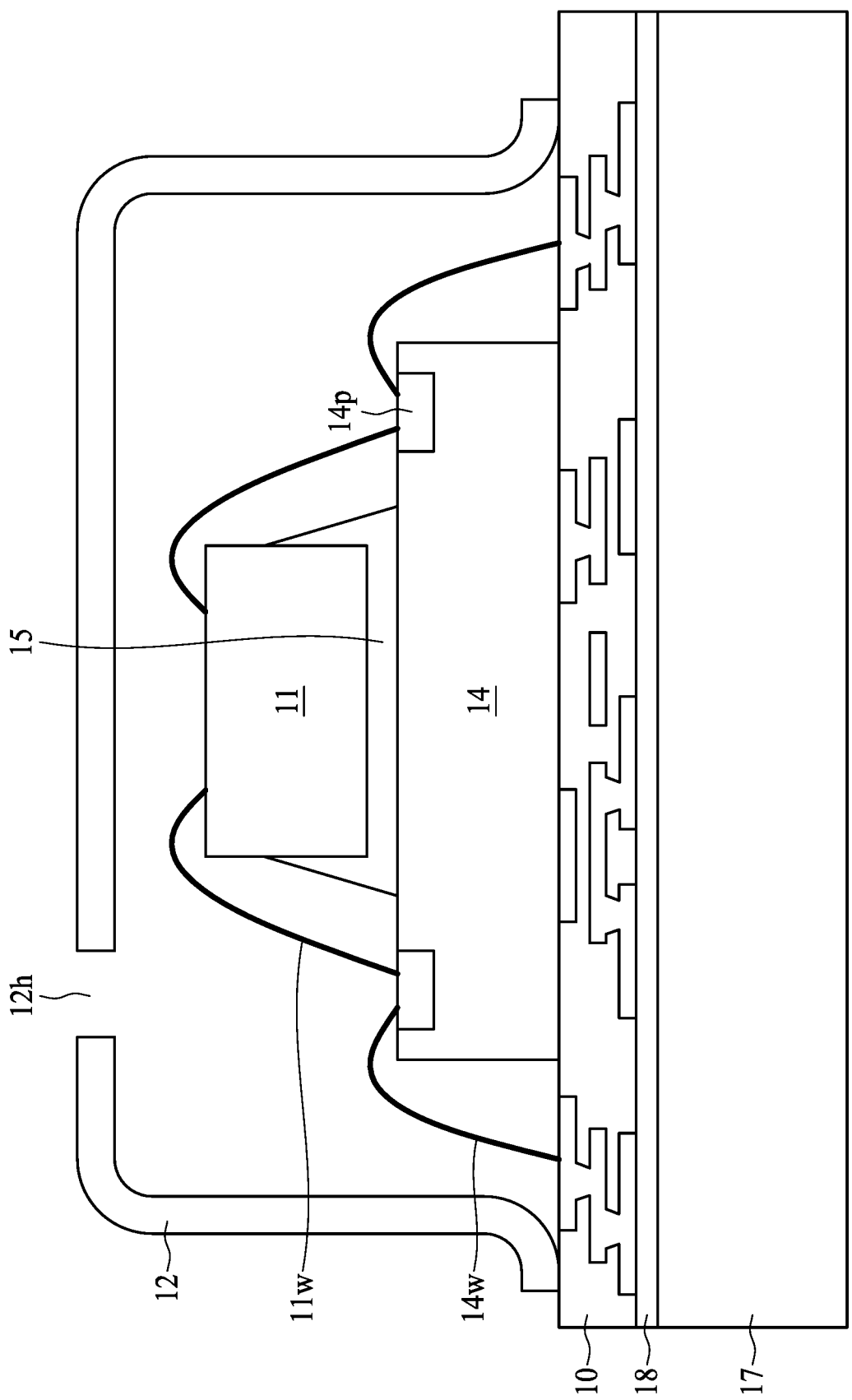
FIG. 3F illustrates an alternative of the method as illustrated with reference to FIG. 3E in accordance with some embodiments of the present disclosure.

FIG. 3F illustrates an alternative of the method as illustrated with reference to FIG. 3E in accordance with some embodiments of the present disclosure. In FIG. 3F, a lid 12 (e.g., a housing) having a penetration hole 12h penetrating the top of the lid is provided. Similar to the embodiment illustrated in FIG. 3E, the lid 12 in FIG. 3F is disposed on the RDL structure 10 and encloses the semiconductor devices 11 and 14.

Figure 3G:
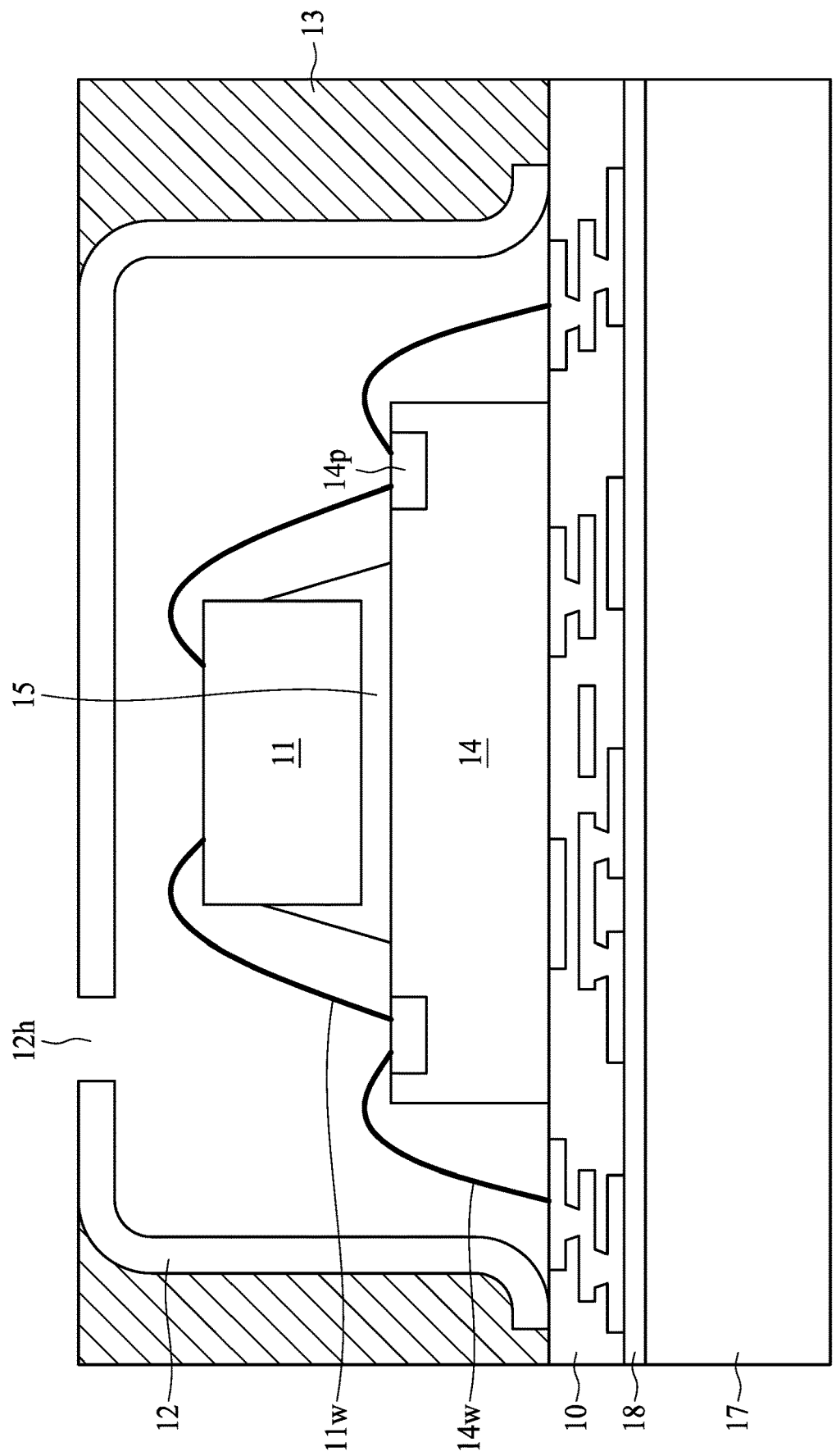

Referring to FIG. 3G, an encapsulant 13 is formed on the RDL structure 10. In some embodiments, the encapsulant 13 may surround or enclose the lid 12. In some embodiments, the encapsulant 13 may be in direct contact with the lid 12.

Figure 3H:
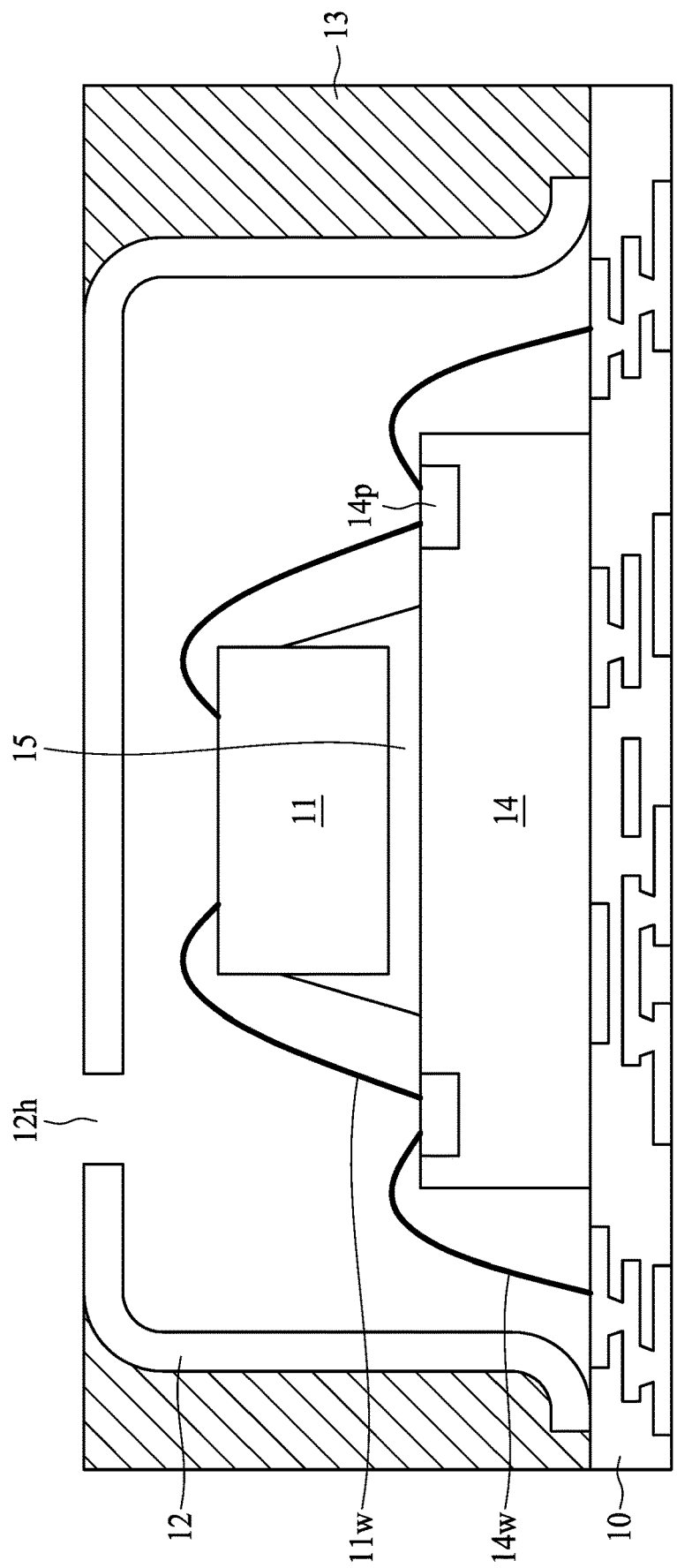

After the formation of the encapsulant 13, the carrier 17 and the release layer 18 is removed as illustrated in FIG. 3H.

Figure 3I:
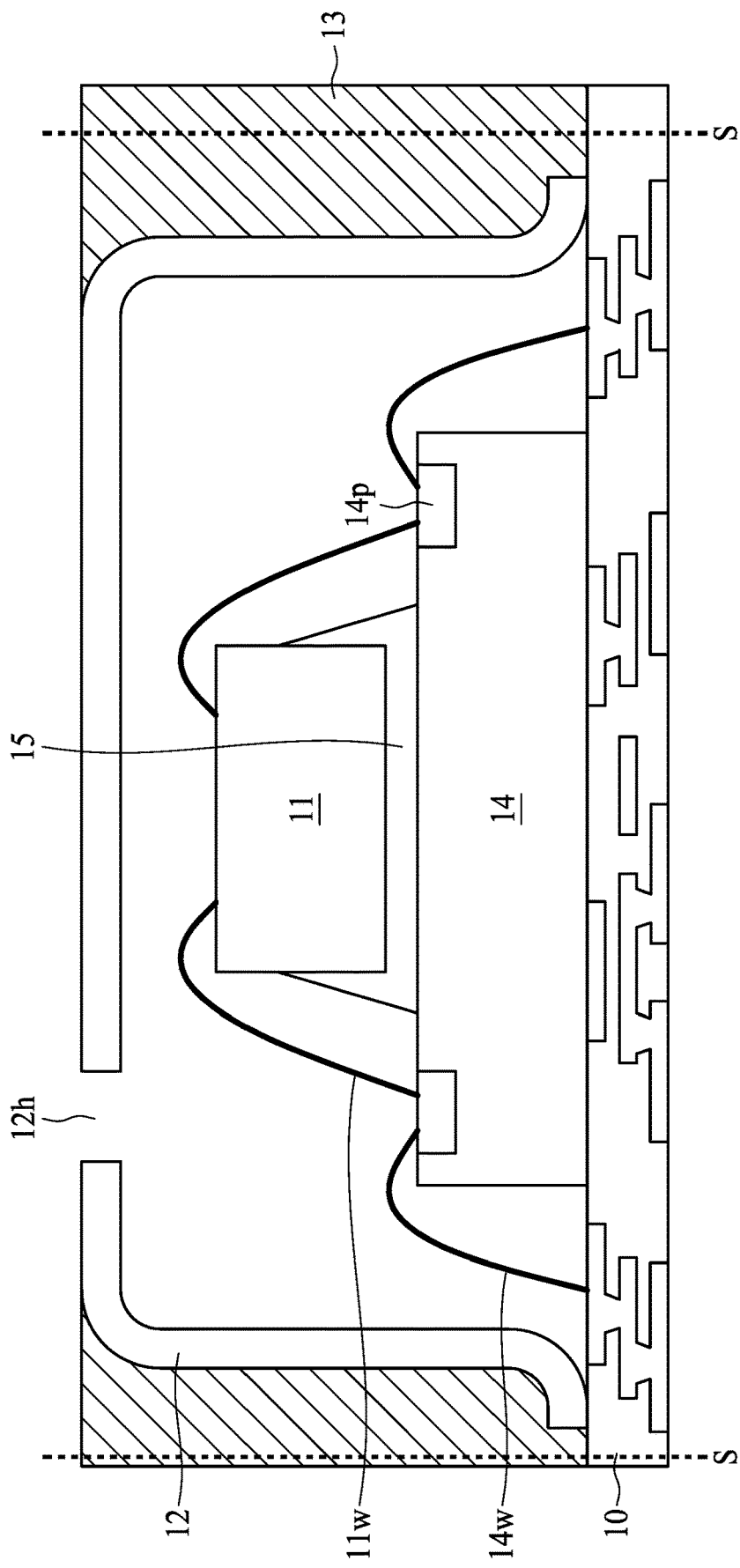

Referring to FIG. 3I, in some embodiments, a singulation operation may be performed, e.g., along the scribe lines S, to form individual semiconductor device packages 1a. The singulation operation may be carried out by cutting or sawing.

In some embodiments, a compression molding process is used to form the encapsulant 13, especially in a wafer-level package. In some embodiments, a transfer molding process is used to form the encapsulant 13, especially in a strip-level package.

Figure 4A:
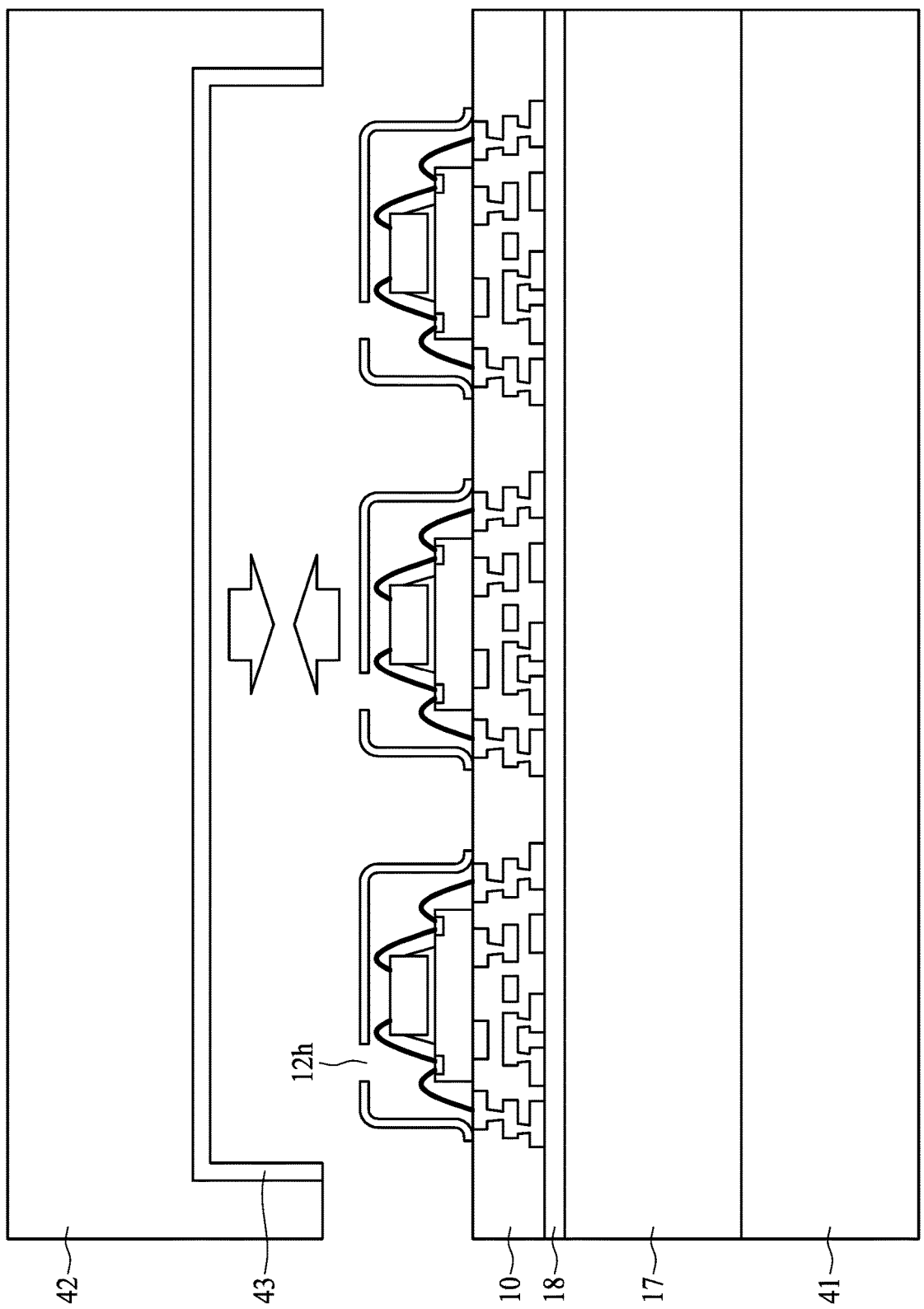
FIG. 4A and FIG. 4B illustrate various steps of the stage as illustrated with reference to FIG. 3G in accordance with some embodiments of the present disclosure.
Figure 4B:
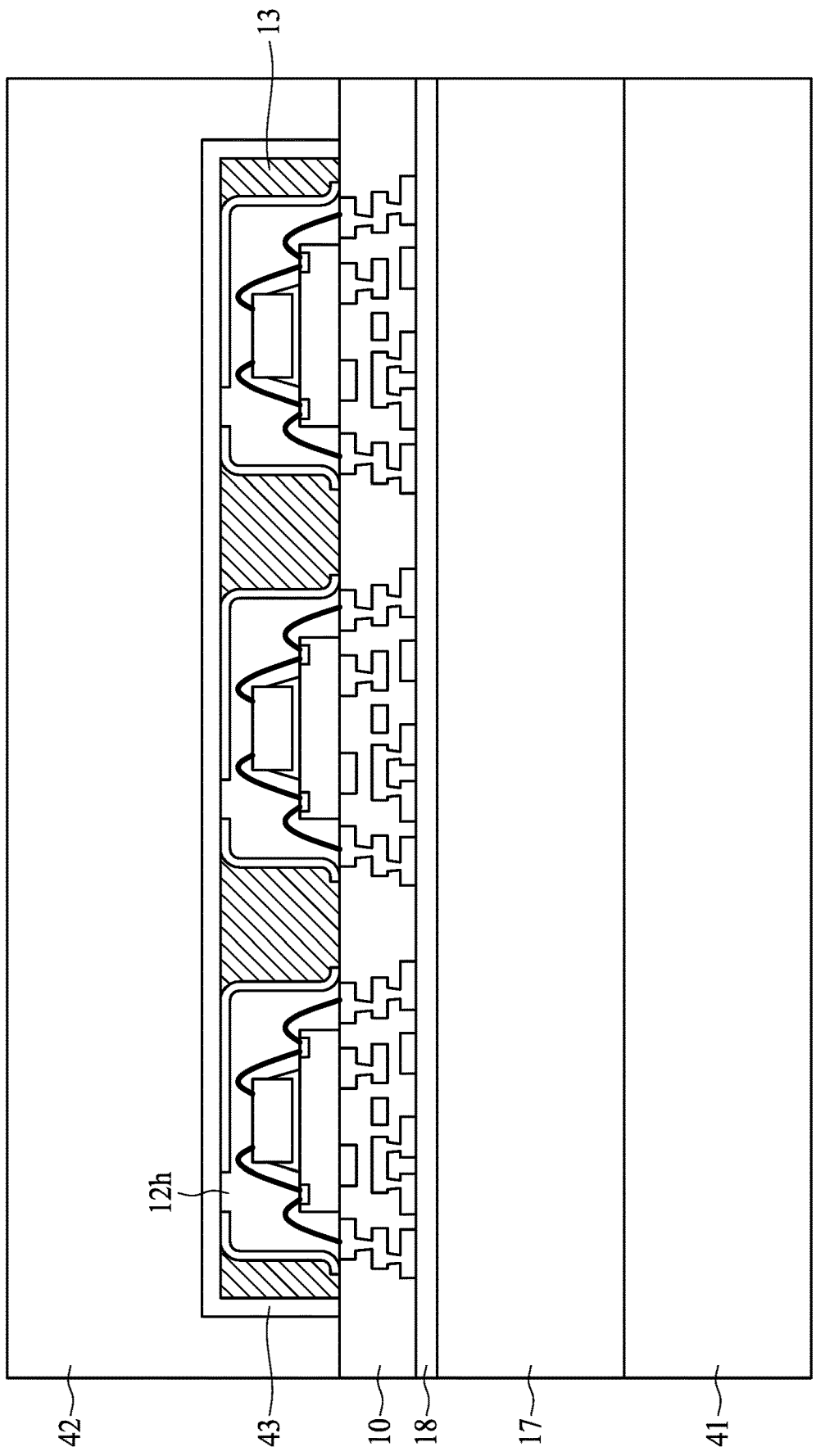

FIG. 4A and FIG. 4B illustrate various steps for forming the encapsulant 13 on the RDL structure 10 as illustrated with reference to FIG. 3G of the method for manufacturing a semiconductor device package in accordance with some embodiments of the present disclosure.

Referring to FIG. 4A, one or more semiconductor device packages (before singulation) as described and illustrated with reference to FIG. 3F are disposed on a bottom mold 41. A top mold 42 moves toward the bottom mold 41. The top mold 42, the bottom mold 41 and the one or more semiconductor device packages define a space for filling a material (e.g., a molding compound) to form the encapsulant 13 as illustrated in FIG. 4B. The shape of the bottom mold 41 and the top mold 42 may be designed as specified. In some embodiments, a protection layer 43 may be attached to the interior of the top mold 42 or a bottom surface the top mold 42. The protection layer 43 may include a release film or rubber material.

As illustrated in FIG. 4B, the protection layer 43 is disposed abutting a top of the lids of the one or more semiconductor device packages. The protection layer 43 covers the penetration hole 12h. A molding compound can be filled into the space defined by the top mold 42, the bottom mold 41 and the one or more semiconductor device packages to form the encapsulant 13, for example, by injection in a transfer molding process. The top mold 42 or the bottom mold 41 or both may be heated to a predetermined temperature to cure the molding compound. The molding compound surrounds the lids of the one or more semiconductor device packages.

After the steps as illustrated in FIG. 4A and FIG. 4B, the bottom mold 41, the top mold 42 and the protection layer 43 can be removed (not shown).

In some embodiments, after the removal of the bottom substrate 41, the top substrate 42 and the protection layer 43, the molding compound may be ground to achieve a predetermined height (not shown).

Figure 5:
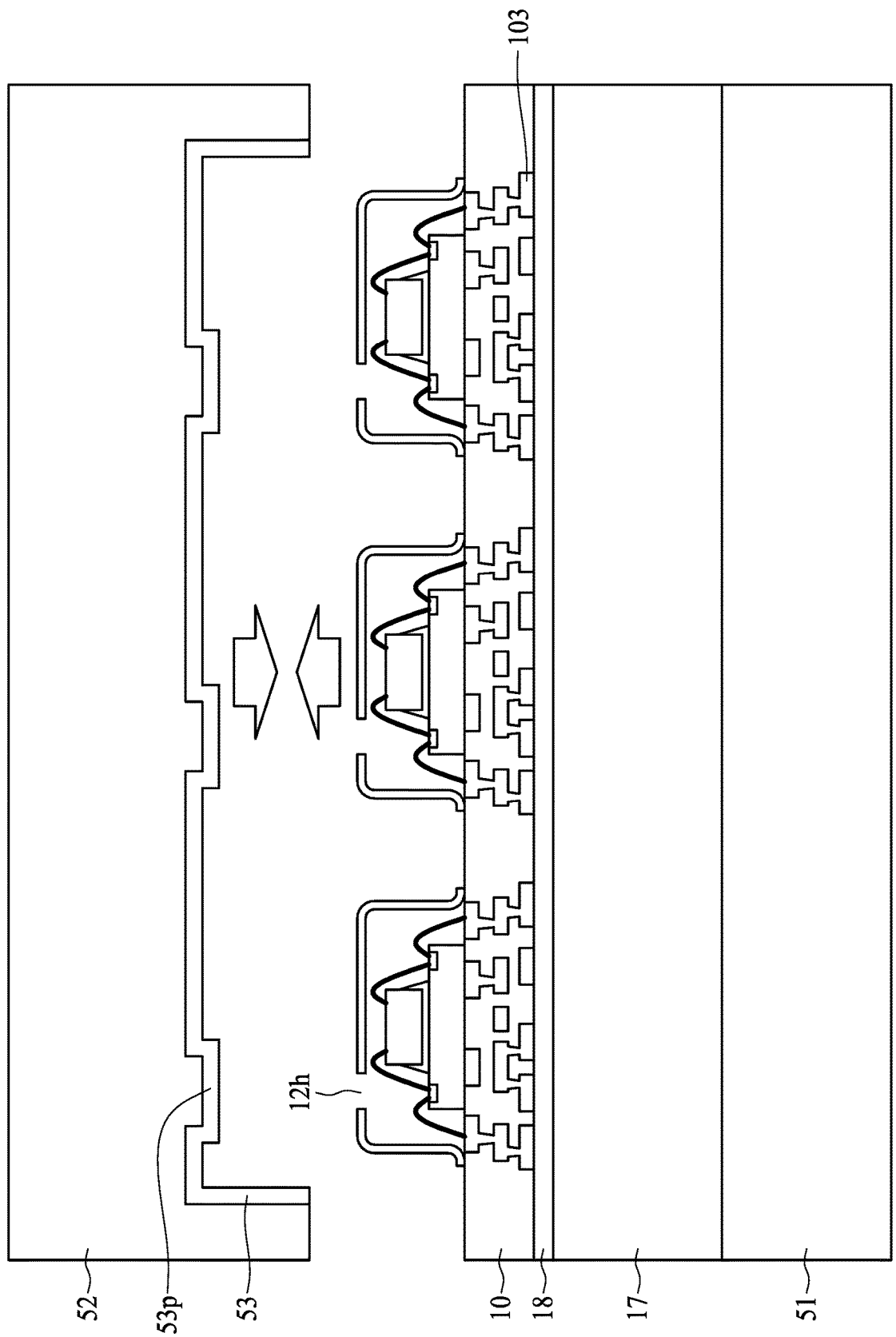
FIG. 5 illustrates an alternative of the method as illustrated with reference to FIG. 4A in accordance with some embodiments of the present disclosure.

FIG. 5 illustrates an alternative of the method as illustrated with reference to FIG. 4A of the method for manufacturing a semiconductor device package accordance with some embodiments of the present disclosure.

In FIG. 5, the protection layer 53 further include a protrusion 53p. When the top mold 52 moves toward the bottom mold 51, the protrusion 53p of the protection layer 53 abuts a portion of the top of the lid and covers the penetration hole 12h of the lid. Therefore, the encapsulant to be formed in a subsequent step would have a height greater than a height of the lid and has an opening (not shown) exposing the penetration hole 12h as the embodiments illustrated in FIG. 1B. In some embodiment, the penetration hole, can provide a pressure relief path when the one or more semiconductor device packages are heated and thereby avoiding potential popcorn effect.

Figure 6:
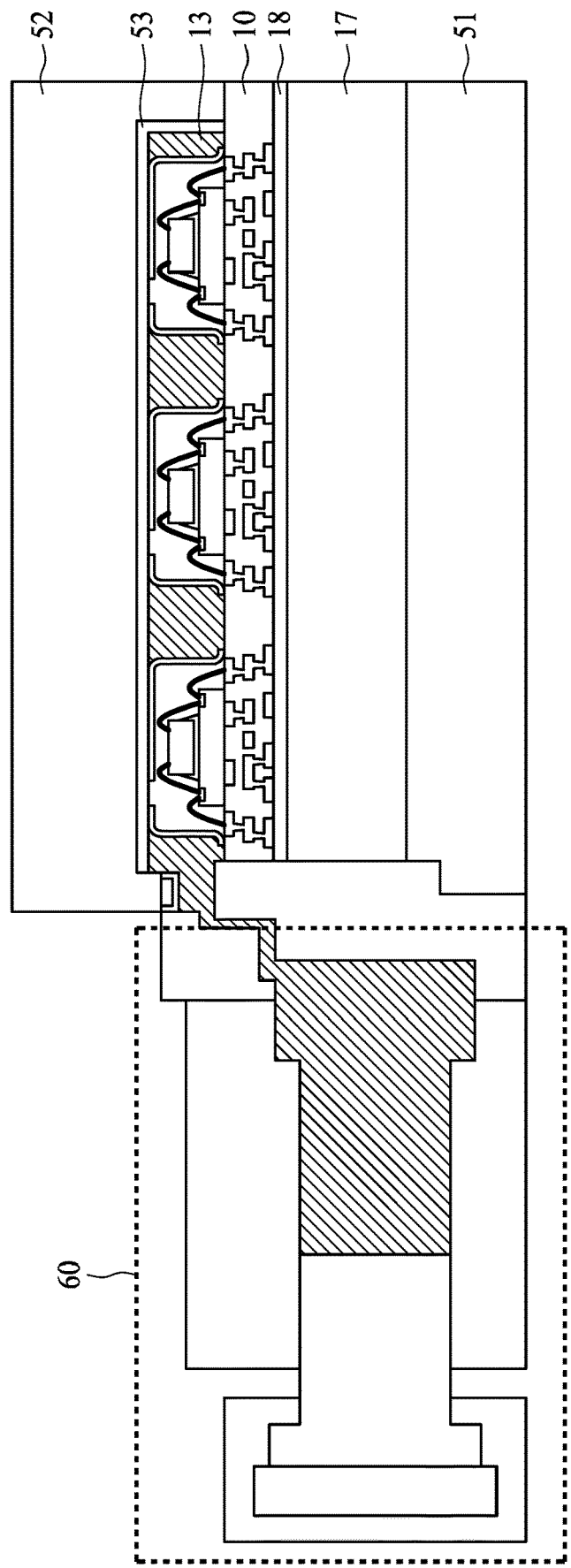
FIG. 6 illustrates a method for manufacturing a semiconductor device package as illustrated in FIG. 3G in accordance with some embodiments of the present disclosure.

FIG. 6 illustrates a method for manufacturing a semiconductor device package as illustrated in FIG. 3G in accordance with some embodiments of the present disclosure.

In FIG. 6, a transfer molding equipment 60 together with the top mold 52 and the bottom mold 51 are used to form the encapsulant 13. A material, e.g., a molding compound is injected from the transfer molding equipment 60 into the space defined by the top mold 52, the bottom mold 51 and the one or more semiconductor device packages and then cured by heating to form the encapsulant.

As illustrated in FIG. 4A, FIG. 4B, FIG. 5 and FIG. 6, the protection layer 43 or 53 further prevents the molding compound from filling into the penetration hole 12h of the lid. Since the molding compound does not enter the interior of the lid, the risk of wire sweep issue can be reduced, even in the case where a transfer molding process is adopted.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a redistribution layer (RDL) structure;
   a lid disposed on the RDL structure and defining a cavity collectively with the RDL structure;
   a sensing component and a semiconductor device disposed in the cavity; and
   an encapsulant encapsulating the lid,
   wherein an opening penetrates through the lid and the encapsulant to provide an only path for communicating the cavity with external environment.

2. The semiconductor device package of claim 1, wherein the semiconductor device is disposed between the sensing component and the RDL structure.

3. The semiconductor device package of claim 2, further comprising an adhesion layer connecting the sensing component with the semiconductor device, wherein the adhesion layer completely covers a bottom surface of the sensing component and completely separates the sensing component from the semiconductor device.

4. The semiconductor device package of claim 3, wherein the adhesion layer at least partially covers a lateral surface of the sensing component, the lateral surface is at a lateral side of the sensing component different from a bottom side at which the bottom surface is.

5. The semiconductor device package of claim 1, wherein the encapsulant is free from being in contact with the sensing component and the semiconductor device.

6. The semiconductor device package of claim 5, wherein a lateral surface of the encapsulant and a lateral surface of the RDL structure are substantially aligned.

7. The semiconductor device package of claim 1, wherein the semiconductor device includes a conductive pad, and wherein the semiconductor device is electrically connected to the sensing component and the RDL structure through the conductive pad.

8. The semiconductor device package of claim 7, further comprising:
a first connection wiring electrically connecting the conductive pad with the sensing component; and
a second connection wiring electrically connecting the conductive pad with the RDL structure.

9. The semiconductor device package of claim 8, wherein the encapsulant is free from being in contact with the first connection wiring and the second connection wiring.

10. The semiconductor device package of claim 9, wherein the first connection wiring comprises two wires disposed symmetrically with respect to two opposite lateral sides of the sensing component and the second connection wiring comprises two wires disposed symmetrically with respect to two opposite lateral sides of the semiconductor device.

11. The semiconductor device package of claim 1, wherein the sensing component and the opening are non-overlapping in a direction perpendicular to a top surface of the RDL structure.

12. The semiconductor device package of claim 11, wherein the opening includes a first part defined by the encapsulant and a second part defined by the lid, wherein a portion of a top surface of the lid is exposed by the first part of the opening, and wherein a depth of the first part is smaller than that of the second part.

13. The semiconductor device package of claim 1, wherein the lid has a first curved portion adjacent to a top surface of the lid and a second curved portion distal to the top surface of the lid, and wherein the first curved portion has a concave surface facing the cavity and the second curved portion has a concave surface facing away from the cavity.

14. The semiconductor device package of claim 13, wherein the lid has a vertical portion connecting the first curved portion and the second curved portion.

15. The semiconductor device package of claim 14, wherein a convex surface of the second curved portion of the lid and a top surface of the RDL structure collectively define a tapered room.

16. The semiconductor device package of claim 14, wherein the first curved portion of the lid has a thickness greater than a thickness of the vertical portion of the lid, and the thickness of the vertical portion of the lid substantially equal to a thickness of the second curved portion of the lid.

17. The semiconductor device package of claim 1, wherein the encapsulant supports the RDL structure.

18. The semiconductor device package of claim 17, wherein the RDL structure includes a polyimide (PI) layer and a metal layer.

19. The semiconductor device package of claim 18, wherein the RDL structure includes a third conductive pad exposed from a top surface of the RDL structure, and the third conductive pad and the top surface of the RDL structure are substantially coplanar, wherein the RDL structure includes a fourth conductive pad exposed by a bottom surface of the RDL structure, and the fourth conductive pad and the bottom surface of the RDL structure are substantially coplanar.

20. The semiconductor device package of claim 19, wherein the third conductive pad and the fourth conductive pad are partially non-overlapping in a direction perpendicular to a top surface of the RDL structure, and wherein the RDL structure includes a conductive trace electrically connecting the third conductive pad and the fourth conductive pad.

* * * * *